(12) United States Patent
Tan et al.

(10) Patent No.: US 10,332,597 B2
(45) Date of Patent: Jun. 25, 2019

(54) FLOATING GATE OTP/MTP STRUCTURE AND METHOD FOR PRODUCING THE SAME

(71) Applicant: GLOBALFOUNDRIES Singapore Pte. Ltd., Singapore (SG)

(72) Inventors: Shyue Seng Tan, Singapore (SG); Danny Pak-Chum Shum, Singapore (SG); Eng Huat Toh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/807,160

(22) Filed: Nov. 8, 2017

(65) Prior Publication Data
US 2019/0139607 A1 May 9, 2019

(51) Int. Cl.
| | | |
|---|---|---|
| G11C 11/34 | (2006.01) | |
| G11C 16/04 | (2006.01) | |
| H01L 29/788 | (2006.01) | |
| H01L 29/66 | (2006.01) | |
| G11C 16/10 | (2006.01) | |
| H01L 27/11517 | (2017.01) | |

(52) U.S. Cl.
CPC ........ *G11C 16/0433* (2013.01); *G11C 16/045* (2013.01); *G11C 16/10* (2013.01); *H01L 27/11517* (2013.01); *H01L 29/66825* (2013.01); *H01L 29/7885* (2013.01); *G11C 2216/10* (2013.01); *G11C 2216/26* (2013.01)

(58) Field of Classification Search
CPC ... G11C 16/0433; G11C 16/10; G11C 16/045; H01L 29/7885; H01L 29/66825; H01L 27/11517

USPC .............................. 365/185.05, 63
See application file for complete search history.

(56) References Cited

U.S. PATENT DOCUMENTS

| | | |
|---|---|---|
| 5,841,165 A | 11/1998 | Chang et al. |
| 6,044,018 A | 3/2000 | Sung et al. |

(Continued)

OTHER PUBLICATIONS

Chang et al., "Non-volatile memory device with ture CMOS compatibility", published in Electronics Letters, vol. 35 No. 17, on on Aug. 19, 1999, retrieved on Aug. 21, 2017 from "http://ieeexplore.ieee.org/document/803599/", pp. 1443-1445, 3 pages.

(Continued)

*Primary Examiner* — Viet Q Nguyen
(74) *Attorney, Agent, or Firm* — Ditthavong & Steiner, P.C.

(57) ABSTRACT

A method of forming a FG OTP/MTP cell with a P+ drain junction at the NCAP region and the resulting device are provided. Embodiments include forming MVPW regions laterally separated in a p-sub; forming a MVNW region in the p-sub between the MVPW regions; forming a first RX, a second RX, and a third RX in the MVPW and MVNW regions, respectively; forming a first and a second pair of floating gates separated over and perpendicular to the first and second RX and the second and third RX, respectively; forming a N+ source region between and adjacent to each FG of the first and the second pair in the second RX; and forming a pair of P+ drain regions in the second RX, each P+ drain region adjacent to a FG of the first pair and a FG of the second pair and remote from the N+ source region.

20 Claims, 3 Drawing Sheets

(56) References Cited

U.S. PATENT DOCUMENTS

| | | | |
|---|---|---|---|
| 6,130,840 A | 10/2000 | Bergemont et al. | |
| 6,166,954 A | 12/2000 | Chern | |
| 6,452,835 B1 | 9/2002 | Diorio et al. | |
| 7,538,379 B1* | 5/2009 | Dhaoui | H01L 27/0203 |
| | | | 257/316 |
| 8,772,108 B1* | 7/2014 | Toh | H01L 29/42328 |
| | | | 257/316 |
| 8,946,806 B2* | 2/2015 | Tan | H01L 27/11521 |
| | | | 257/314 |
| 9,515,152 B2* | 12/2016 | Guo | H01L 29/42328 |
| 9,608,081 B2* | 3/2017 | Tan | H01L 29/42324 |
| 9,614,027 B2* | 4/2017 | Tan | H01L 29/0619 |
| 9,659,943 B1* | 5/2017 | Tran | H01L 27/11206 |
| 9,818,867 B2* | 11/2017 | Tan | H01L 29/42324 |
| 9,847,133 B2* | 12/2017 | Lai | G11C 16/12 |
| 10,090,311 B1* | 10/2018 | Guo | H01L 27/11521 |
| 10,096,602 B1* | 10/2018 | Tan | H01L 29/42328 |
| 2007/0045673 A1* | 3/2007 | Jeon | H01L 21/28273 |
| | | | 257/261 |

OTHER PUBLICATIONS

Bergemont, "Future and limitations of floating gate NVM manufacturing", Maxim Integrated Products, EDS, Sep. 12, 2006, 96 pages.

* cited by examiner

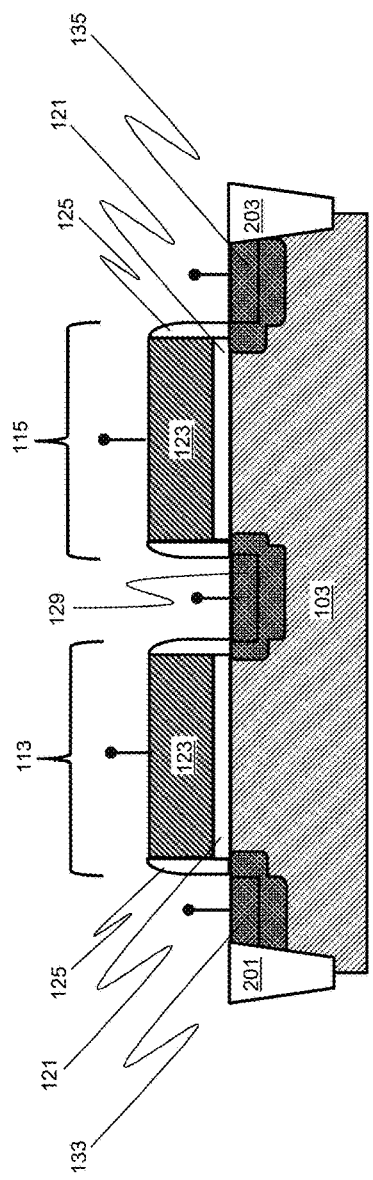
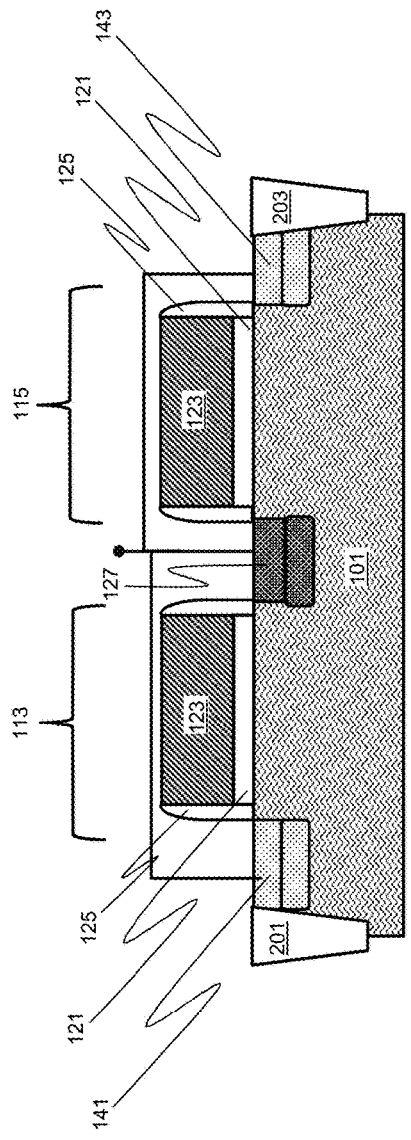
FIG. 2A
FIG. 2B

FLOATING GATE OTP/MTP STRUCTURE AND METHOD FOR PRODUCING THE SAME

TECHNICAL FIELD

The present disclosure relates to a memory design for semiconductor devices. The present disclosure is particularly applicable to fabricating floating gate (FG) one-time programmable (OTP) and/or multiple-time programmable (MTP) memory devices.

BACKGROUND

A known 4 bit FG OTP/MTP cell has a cell size of 2.35 micrometer squared ($\mu m^2$) or a 180 nanometer (nm) technology node Feature (F) size of 92 $F^2$, which can create design restrictions as cell scaling increases. Known FG OTP/MTP devices also have a low coupling ratio. For example, when the control gate line voltage (VCGL) of a known device equals 10 volt (V), the floating gate voltage (VFG) equals 8 V, i.e., the known device has a coupling ration of 0.8 or an effective gate over substrate bias of −2 V. Known solutions for improving the coupling ratio; however, involve additional costly masking steps.

A need therefore exists for methodology enabling the formation of a FG OTP/MTP cell with a high coupling ratio and a small cell size without requiring additional masks and the resulting device.

SUMMARY

An aspect of the present disclosure is method of forming a FG OTP/MTP cell with a p-type (P+) drain junction at the n-type capacitor (NCAP) region.

Another aspect of the present disclosure is a FG OTP/MTP cell with a P+ drain junction at the NCAP region.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first middle-voltage p-type well (MVPW) region and a second MVPW region laterally separated in a p-type substrate (p-sub); forming a middle-voltage n-type well (MVNW) region in the p-sub between and adjacent to the first MVPW region and the second MVPW region; forming a first active region (RX), a second RX, and a third RX in the first MVPW region, the MVNW region, and the second MVPW region, respectively; forming a first pair of floating gates and a second pair of floating gates separated over and perpendicular to the first RX and the second RX and the second RX and the third RX, respectively; forming a n-type (N+) source region between and adjacent to each FG of the first pair and the second pair in the second RX; and forming a pair of P+ drain regions in the second RX, each P+ drain region adjacent to a FG of the first pair and a FG of the second pair and remote from the N+ source region.

Aspects of the present disclosure include forming each FG by: forming a middle-voltage (MV) gate oxide layer over portions of the first MVPW region, the first RX region, the MVNW region, the second RX region, the second MVPW region, and the third RX; forming a polysilicon layer over the MV gate oxide layer; and forming a MV oxide spacer along each sidewall of the MV gate oxide layer and the polysilicon layer, wherein an upper surface of the polysilicon layer and an upper surface of the MV oxide spacer are coplanar. Other aspects include each FG of the first pair including a transistor over the first RX and an NCAP over the second RX and each FG of the second pair including a transistor over the third RX and an NCAP over the second RX, and wherein each NCAP is coupled through the MVNW region. Further aspects include forming a first N+ drain region and a second N+ drain region on opposite sides of the first pair of floating gates in the first RX; forming a third N+ drain region and a fourth N+ drain region on opposite sides of the second pair of floating gates in the second RX; forming a second N+ source region between the first pair of floating gates in the first RX; and forming a third N+ source region between the second pair of floating gates in the third RX. Another aspect includes connecting the first N+ drain region, the second N+ drain region, the third N+ drain region, and the fourth N+ drain region to a first bitline (BL0), a second bitline (BL1), a third bitline (BL2), and a fourth bitline (BL3), respectively; connecting the second N+ source region to a source line (SL); and connecting the N+ source region and the pair of P+ drain regions to a control gate line (CGL). Additional aspects include forming a first shallow trench isolation (STI) structure adjacent to the first N+ drain region, a P+ drain region, and the third N+ drain region through a portion of each of the first MVPW region, the MVNW region, and the second MVPW region; and forming a second STI structure adjacent to the second N+ drain region, a P+ drain region, and the fourth N+ drain region through a portion of each of the first MVPW region, the MVNW region, and the second MVPW region. Other aspects include forming the pair of P+ drain regions by: implanting boron (B) or B plus difluoroboron (B+BF$_2$). Further aspects include implanting the B or B+BF$_2$ at an energy of 2 kiloelectron-volt (KeV) to 20 KeV and a dose of 1E14/centimeter squared (cm$^2$) to 1E15/cm$^2$.

Another aspect of the present disclosure is a device including: a first MVPW region and a second MVPW region in a p-sub; a MVNW region in the p-sub between and adjacent to the first MVPW region and the second MVPW region; a first RX, a second RX, and a third RX in the first MVPW region, the MVNW region, and the second MVPW region, respectively; a first pair of floating gates and a second pair of floating gates separated and over and perpendicular to the first RX and the second RX and the second RX and the third RX, respectively; an N+ source region between and adjacent to each FG in the second RX; and a pair of P+ drain regions in the second RX, each P+ drain region adjacent to a FG of the first pair and a FG of the second pair and remote from the N+ source region.

Aspects of the device include each FG including a MV gate oxide layer over portions of the first MVPW region, the first RX region, the MVNW region, the second RX region, the second MVPW region, and the third RX; a polysilicon layer over the MV gate oxide layer; and a MV oxide spacer along each sidewall of the MV gate oxide layer and the polysilicon layer, wherein an upper surface of the polysilicon layer and an upper surface of the MV oxide spacer are coplanar. Other aspects include each FG of the first pair including a transistor over the first RX and an NCAP over the second RX and each FG of the second pair including a transistor over the third RX and an NCAP over the second RX. Further aspects include the MVNW region coupling each NCAP. Another aspect includes a first N+ drain region and a second N+ drain region on opposite sides of the first pair of floating gates in the first RX; a third N+ drain region and a fourth N+ drain region on opposite sides of the second pair of floating gates in the second RX; a second N+ source region between the first pair of floating gates in the first RX; and a third N+ source region between the second pair of floating gates in the third RX. Additional aspects include a first bitline (BL0), a second bitline (BL1), a third bitline (BL2), and a fourth bitline (BL3) connected to the first N+ drain region, the second N+ drain region, the third N+ drain region, and the fourth N+ drain region, respectively; a SL connected to the second N+ source region; and a CGL connected to the N+ source region and the pair of P+ drain regions. Other aspects include a first STI structure adjacent to the first N+ drain region, a P+ drain region, and the third N+ drain region through a portion of each of the first MVPW region, the MVNW region, and the second MVPW region; and a second STI structure adjacent to the second N+ drain region, a P+ drain region, and the fourth N+ drain region through a portion of each of the first MVPW region, the MVNW region, and the second MVPW region. Another aspect includes the pair of P+ drain regions being B implants or $BF_2$ implants.

A further aspect of the present disclosure is a device including: a first MVPW region and a second MVPW region in a p-sub; a MVNW region in the p-sub between and adjacent to the first MVPW region and the second MVPW region; a first RX, a second RX, and a third RX in the first MVPW region, the MVNW region, and the second MVPW region, respectively; a first pair of floating gates and a second pair of floating gates separated and over and perpendicular to the first RX and the second RX and the second RX and the third RX, respectively; a first N+ source region between and adjacent to each FG in the second RX; a pair of P+ B or B+$BF_2$ drain regions in the second RX, each P+ B or B+$BF_2$ drain region adjacent to a FG of the first pair and a FG of the second pair and remote from the N+ source region; a first N+ drain region and a second N+ drain region on opposite sides of the first pair of floating gates in the first RX; a third N+ drain region and a fourth N+ drain region on opposite sides of the second pair of floating gates in the second RX; a second N+ source region between the first pair of floating gates in the first RX; and a third N+ source region between the second pair of floating gates in the third RX.

Aspects of the device include each FG including a MV gate oxide layer over portions of the first MVPW region, the first RX region, the MVNW region, the second RX region, the second MVPW region, and the third RX; a polysilicon layer over the MV gate oxide layer; and a MV oxide spacer along each sidewall of the MV gate oxide layer and the polysilicon layer, wherein an upper surface of the polysilicon layer and an upper surface of the MV oxide spacer are coplanar. Other aspects include each FG of the first pair including a transistor over the first RX and an NCAP over the second RX and each FG of the second pair comprises a transistor over the third RX and an NCAP over the second RX, and the MVNW region couples each NCAP. Further aspects include a first bitline (BL0), a second bitline (BL1), a third bitline (BL2), and a fourth bitline (BL3) connected to the first N+ drain region, the second N+ drain region, the third N+ drain region, and the fourth N+ drain region, respectively; a SL connected to the second N+ source region; and a CGL connected to the first N+ source region and the pair of P+ B or B+$BF_2$ drain regions.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A and 2B schematically illustrate cross-sectional views of FIG. 1, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of a resultant large cell size and low coupling ratio attendant upon forming a FG OTP/MTP device without additional costly masking steps. The problems are solved, inter alia, by forming a FG OTP/MTP cell with a P+ drain junction at the NCAP region.

Methodology in accordance with embodiments of the present disclosure includes forming a first MVPW region and a second MVPW region laterally separated in a p-sub. A MVNW region is formed in the p-sub between and adjacent to the first MVPW region and the second MVPW region. A first RX, a second RX, and a third RX are formed in the first MVPW region, the MVNW region, and the second MVPW region, respectively. A first pair of floating gates and a second pair of floating gates are formed separated over and perpendicular to the first RX and the second RX and the second RX and the third RX, respectively. An N+ source region is formed between and adjacent to each FG of the first pair and the second pair in the second RX; and a pair of P+ drain regions are formed in the second RX, each P+ drain region adjacent to a FG of the first pair and a FG of the second pair and remote from the N+ source region.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
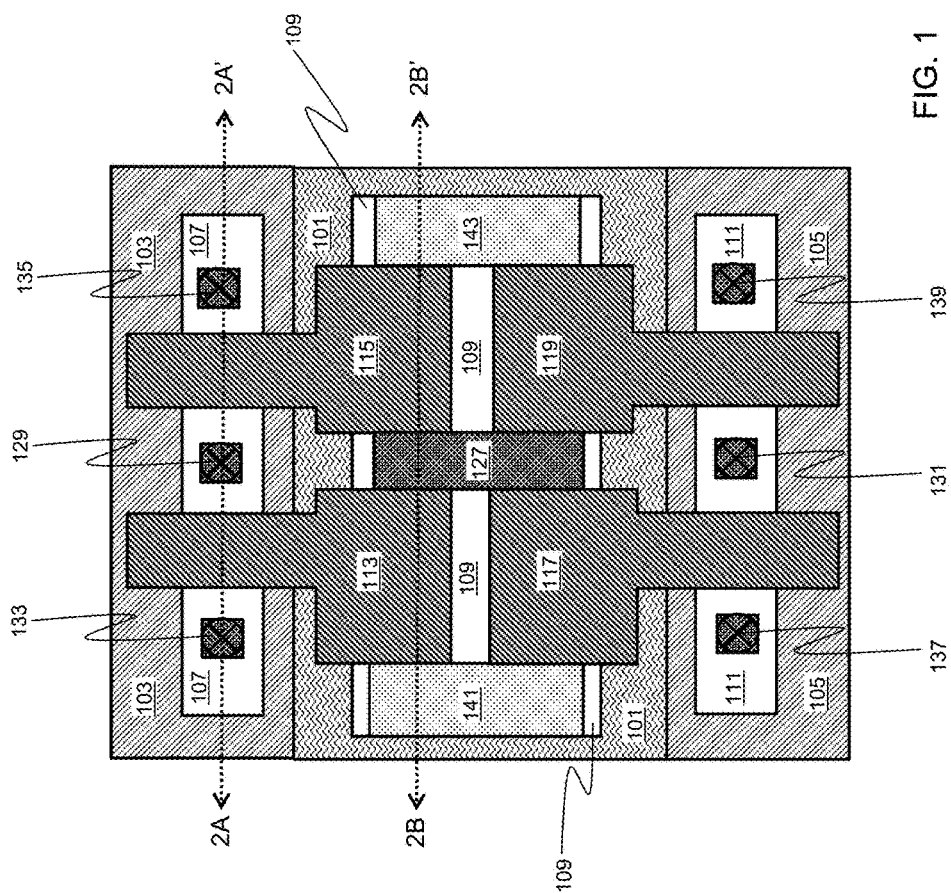
FIG. 1 schematically illustrates a top view of a FG OTP/MTP cell with a P+ drain junction at the NCAP region, in accordance with an exemplary embodiment.
Figure 3:
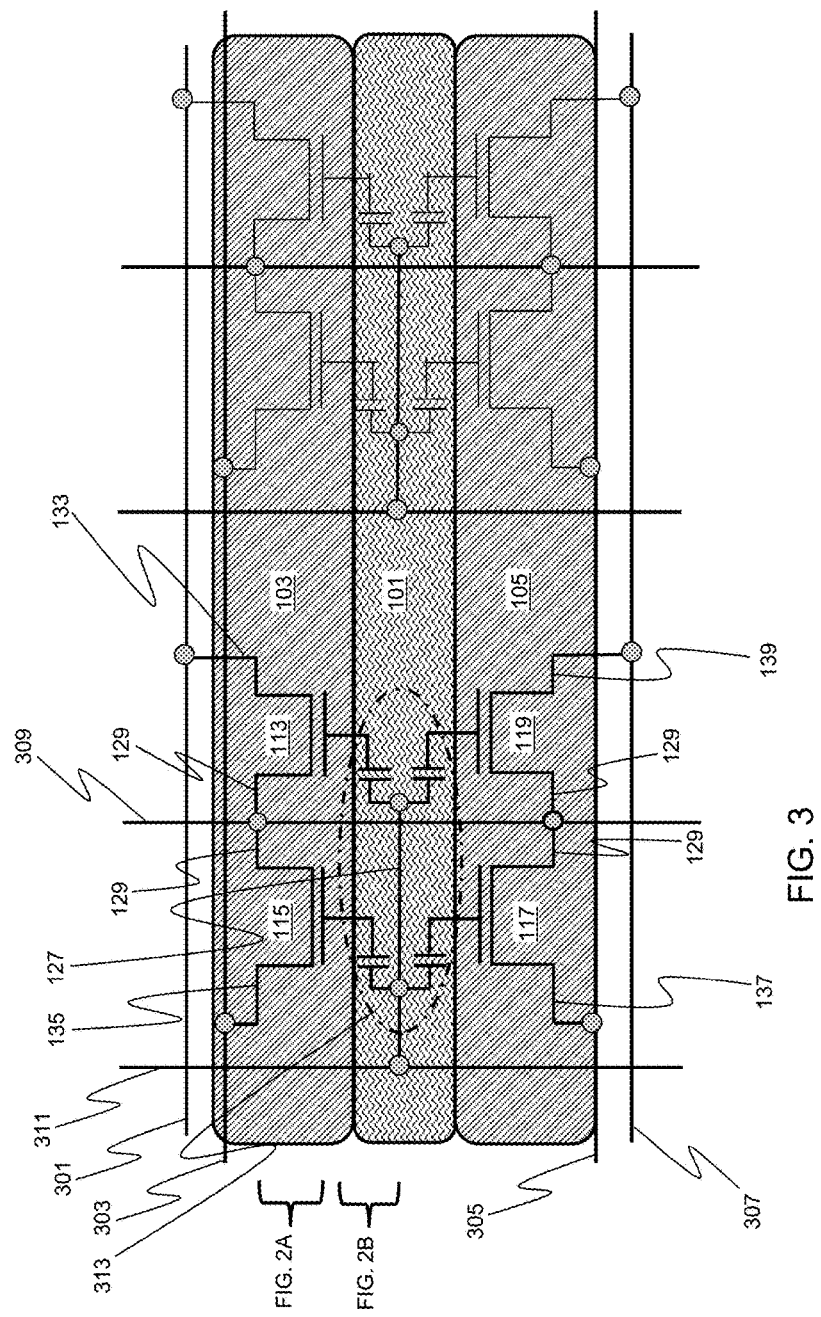
FIG. 3 schematically illustrates an array schematic of FIGS. 1, 2A, and 2B, in accordance with an exemplary embodiment.

FIG. 1 schematically illustrates a top view of a FG OTP/MTP cell with a P+ implant at the NCAP region, FIGS. 2A and 2B schematically illustrate respective cross-sectional views along the lines 2A-2A' and 2B-2B' of FIG. 1, and FIG. 3 schematically illustrates an array schematic of FIGS. 1, 2A, and 2B, all in accordance with an exemplary embodiment. Referring to FIGS. 1, 2A, 2B, and 3, a MVNW region 101 is formed in a p-sub (not shown for illustrative convenience) between and adjacent to MVPW regions 103 and 105, which are also formed in the p-sub. RX 107, 109, and 111, are formed in the MVPW region 103, MVNW region 101, and MVPW region 105, respectively.

FG 113 and 115 and FG 117 and 119 are formed separated over and perpendicular to the RX 107 and 109 and RX 109 and 111, respectively. Each FG 113, 115, 117, and 119 is formed, e.g., of a MV gate layer 121, a polysilicon layer 123, and MV oxide spacers 125, wherein an upper surface of the polysilicon layer 123 and an upper surface of the MV over spacers 125 are coplanar. In this instance, the portion of the FG 113 and 115 over the RX 107, as depicted in FIG. 2A, and the portion of the FG 117 and 119 over the RX 111 forms 4 separate transistors, and the portion of the FG 113 and 115 over the RX 109, as depicted in FIG. 2B, and the portion of the FG 117 and 119 also over the RX 109 forms 4 separate NCAP, which are coupled through the MVNW region 101, i.e., the 4 bits share one coupling cap. In addition, the 1 transistor plus 1 capacitor (1T+1C) configuration enables device programming by channel hot injection (CHE) and device erasing by Fowler-Nordheim tunneling (FN).

An N+ source region 127 is formed between and adjacent to each FG 113, 115, 117, and 119 in the RX 109, i.e., a shared N+ source region 127 is formed, and the N+ source regions 129 and 131 are formed between the FG 113 and 115 in the RX 107 and between the FG 117 and 119 in the RX 111, respectively. N+ drain regions 133 and 135 are formed on opposite sides of the FG 113 and 115 in the RX 107 and N+ drain regions 137 and 139 are formed on opposite sides of the FG 117 and 119 in the RX 111. At or about the same time, P+ drain regions 141 and 143 are formed adjacent to the FG 113 and 117 and FG 115 and 119, respectively, i.e., shared P+ drain regions 141 and 143 are formed. The P+ drain regions 141 and 143 may be formed, e.g., by implanting B or B+BF2 in the RX 109 at an energy of 2 KeV to 20 KeV and a dose of $1E14/cm^2$ to $1E15/cm^2$.

In this instance, the N+ drain regions 133, 135, 137, and 139 are connected to the BL0 301, BL1 303, BL2 305, and BL3 307 of FIG. 3, respectively. The N+ source region 129 is connected to the SL 309 of FIG. 3 and the N+ source region 129 and the P+ drain regions 141 and 143 are connected to the CGL 311 of FIG. 3 as a result of the coupled NCAP of FG 113, 115, 117, and 119, as highlighted by the circle 313 of FIG. 3. Consequently, any bias applied to the P+ drain region 141 or 143 will be coupled onto the FG 113, 115, 117, and 119; the efficiency of which depends on the specific coupling ratio.

Referring to FIGS. 2A and 2B, an STI structure 201 is formed adjacent to the N+ drain region 131, the P+ drain region 141, and the N+ drain region 137 through a portion of each of the MVPW region 103, the MVNW region 101, and the MVPW region 105. Likewise, an STI structure 203 is formed adjacent to the N+ drain region 135, the P+ drain region 143, and the N+ drain region 139 through a portion of each of the MVPW region 103, the MVNW region 101, and the MVPW region 105. Consequently, the resultant OTP/MTP bitcell size is approximately 2.38 $\mu m^2$ or 73 $F^2$ compared to a known OTP/MTP bitcell size of 92 $F^2$, as described above.

The embodiments of the present disclosure can achieve several technical effects such as enabling CHE/FN programming and erasing, respectively; improving device capacitance, e.g., by approximately 3.3 times, and the resulting coupling ratio, e.g., by 13%; enabling 4 bits to share one common coupling cap; and reducing the bitcell size relative to a known OTP/MTP cell size. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in any IC devices with OTP or MTP memory devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a first middle-voltage p-type well (MVPW) region and a second MVPW region laterally separated in a p-type substrate (p-sub);
   forming a middle-voltage n-type well (MVNW) region in the p-sub between and adjacent to the first MVPW region and the second MVPW region;
   forming a first active region (RX), a second RX, and a third RX in the first MVPW region, the MVNW region, and the second MVPW region, respectively;
   forming a first pair of floating gates and a second pair of floating gates laterally separated over and perpendicular to the first RX and the second RX and the second RX and the third RX, respectively;
   forming a n-type (N+) source region between and adjacent to each floating gate (FG) of the first pair and the second pair in the second RX; and
   forming a pair of p-type (P+) drain regions in the second RX, each P+ drain region adjacent to a FG of the first pair and a FG of the second pair and remote from the N+ source region.

2. The method according to claim 1, comprising forming each FG by:
   forming a middle-voltage (MV) gate oxide layer over portions of the first MVPW region, the first RX region, the MVNW region, the second RX region, the second MVPW region, and the third RX;
   forming a polysilicon layer over the MV gate oxide layer; and
   forming a MV oxide spacer along each sidewall of the MV gate oxide layer and the polysilicon layer.

3. The method according to claim 1, wherein each FG of the first pair comprises a transistor over the first RX and an n-type capacitor (NCAP) over the second RX and each FG of the second pair comprises a transistor over the third RX and an NCAP over the second RX, and wherein each NCAP is coupled through the MVNW region.

4. The method according to claim 1, further comprising:
forming a first N+ drain region and a second N+ drain region on opposite sides of the first pair of floating gates in the first RX;
forming a third N+ drain region and a fourth N+ drain region on opposite sides of the second pair of floating gates in the second RX;
forming another second N+ source region between the first pair of floating gates in the first RX; and
forming a third N+ source region between the second pair of floating gates in the third RX.

5. The method according to claim 4, further comprising:
connecting the first N+ drain region, the second N+ drain region, the third N+ drain region, and the fourth N+ drain region to a first bitline (BL0), a second bitline (BL1), a third bitline (BL2), and a fourth bitline (BL3), respectively;
connecting the second N+ source region to a source line (SL); and
connecting the N+ source region and the pair of P+ drain regions to a control gate line (CGL).

6. The method according to claim 5, further comprising:
forming a first shallow trench isolation (STI) structure adjacent to the first N+ drain region, a P+ drain region, and the third N+ drain region through a portion of each of the first MVPW region, the MVNW region, and the second MVPW region; and
forming a second STI structure adjacent to the second N+ drain region, a P+ drain region, and the fourth N+ drain region through a portion of each of the first MVPW region, the MVNW region, and the second MVPW region.

7. The method according to claim 1, comprising forming the pair of P+ drain regions by:
implanting boron (B) or B plus difluoroboron ($B+BF_2$).

8. The method according to claim 7, comprising implanting the B or $B+BF_2$ at an energy of 2 kiloelectron-volt (KeV) to 20 KeV and a dose of $1E14$/centimeter squared ($cm^2$) to $1E15/cm^2$.

9. A device comprising:
a first middle-voltage p-type well (MVPW) region and a second MVPW region in a p-type substrate (p-sub);
a middle-voltage n-type well (MVNW) region in the p-sub between and adjacent to the first MVPW region and the second MVPW region;
a first active region (RX), a second RX, and a third RX in the first MVPW region, the MVNW region, and the second MVPW region, respectively;
a first pair of floating gates and a second pair of floating gates laterally separated and over and perpendicular to the first RX and the second RX and the second RX and the third RX, respectively;
an n-type (N+) source region between and adjacent to each floating gate (FG) in the second RX; and
a pair of p-type (P+) drain regions in the second RX, each P+ drain region adjacent to a FG of the first pair and a FG of the second pair and remote from the N+ source region.

10. The device according to claim 9, wherein each FG comprises:
a middle-voltage (MV) gate oxide layer over portions of the first MVPW region, the first RX region, the MVNW region, the second RX region, the second MVPW region, and the third RX;
a polysilicon layer over the MV gate oxide layer; and
a MV oxide spacer along each sidewall of the MV gate oxide layer and the polysilicon layer.

11. The device according to claim 9, wherein each FG of the first pair comprises a transistor over the first RX and an n-type capacitor (NCAP) over the second RX and each FG of the second pair comprises a transistor over the third RX and an NCAP over the second RX.

12. The device according to claim 11, wherein the MVNW region couples each NCAP.

13. The device according to claim 9, further comprising:
a first N+ drain region and a second N+ drain region on opposite sides of the first pair of floating gates in the first RX;
a third N+ drain region and a fourth N+ drain region on opposite sides of the second pair of floating gates in the second RX;
another second N+ source region between the first pair of floating gates in the first RX; and
a third N+ source region between the second pair of floating gates in the third RX.

14. The device according to claim 13, further comprising:
a first bitline (BL0), a second bitline (BL1), a third bitline (BL2), and a fourth bitline (BL3) connected to the first N+ drain region, the second N+ drain region, the third N+ drain region, and the fourth N+ drain region, respectively;
a source line (SL) connected to the second N+ source region; and
a control gate line (CGL) connected to the N+ source region and the pair of P+ drain regions.

15. The device according to claim 14, further comprising:
a first shallow trench isolation (STI) structure adjacent to the first N+ drain region, a P+ drain region, and the third N+ drain region through a portion of each of the first MVPW region, the MVNW region, and the second MVPW region; and
a second STI structure adjacent to the second N+ drain region, a P+ drain region, and the fourth N+ drain region through a portion of each of the first MVPW region, the MVNW region, and the second MVPW region.

16. The device according to claim 9 wherein the pair of P+ drain regions comprise boron (B) implants or B plus difluoroboron ($BF_2$) implants.

17. A device comprising:
a first middle-voltage p-type well (MVPW) region and a second MVPW region in a p-type substrate (p-sub);
a middle-voltage n-type well (MVNW) region in the p-sub between and adjacent to the first MVPW region and the second MVPW region;
a first active region (RX), a second RX, and a third RX in the first MVPW region, the MVNW region, and the second MVPW region, respectively;
a first pair of floating gates and a second pair of floating gates laterally separated and over and perpendicular to the first RX and the second RX and the second RX and the third RX, respectively;
a first n-type (N+) source region between and adjacent to each floating gate (FG) in the second RX;
a pair of p-type (P+) boron (B) or B plus difluoroboron ($B+BF_2$) drain regions in the second RX, each P+B or $B+BF_2$ source region adjacent to a FG of the first pair and a FG of the second pair and remote from the N+ source region;
a first N+ drain region and a second N+ drain region on opposite sides of the first pair of floating gates in the first RX;

a third N+ drain region and a fourth N+ drain region on opposite sides of the second pair of floating gates in the second RX;
a second N+ source region between the first pair of floating gates in the first RX; and
a third N+ source region between the second pair of floating gates in the third RX.

18. The device according to claim 17, wherein each FG comprises:
a middle-voltage (MV) gate oxide layer over portions of the first MVPW region, the first RX region, the MVNW region, the second RX region, the second MVPW region, and the third RX;
a polysilicon layer over the MV gate oxide layer; and
a MV oxide spacer along each sidewall of the MV gate oxide layer and the polysilicon layer.

19. The device according to claim 17, wherein each FG of the first pair comprises a transistor over the first RX and an n-type capacitor (NCAP) over the second RX and each FG of the second pair comprises a transistor over the third RX and an NCAP over the second RX, and the MVNW region couples each NCAP.

20. The device according to claim 17, further comprising:
a first bitline (BL0), a second bitline (BL1), a third bitline (BL2), and a fourth bitline (BL3) connected to the first N+ drain region, the second N+ drain region, the third N+ drain region, and the fourth N+ drain region, respectively;
a source line (SL) connected to the second N+ source region; and
a control gate line (CGL) connected to the first N+ source region and the pair of P+ B or B+BF$_2$ source regions.

* * * * *